(12) United States Patent
Hsu et al.

(10) Patent No.: US 9,379,697 B2
(45) Date of Patent: Jun. 28, 2016

(54) GATE DRIVER CIRCUIT AND DISPLAY APPARATUS HAVING THE SAME

(71) Applicant: INNOLUX CORPORATION, Miaoli County (TW)

(72) Inventors: Wen-Tsai Hsu, Miaoli County (TW); Chien-Hsueh Chiang, Miaoli County (TW)

(73) Assignee: INNOLUX CORPORATION, Miaoli County (TW)

( * ) Notice: Subject to any disclaimer, the term of this patent is extended or adjusted under 35 U.S.C. 154(b) by 392 days.

(21) Appl. No.: 13/970,996

(22) Filed: Aug. 20, 2013

(65) Prior Publication Data

US 2014/0055442 A1 Feb. 27, 2014

(30) Foreign Application Priority Data

Aug. 21, 2012 (TW) .............................. 101130268 A

(51) Int. Cl.
*G09G 5/00* (2006.01)
*H03K 17/16* (2006.01)
*G09G 3/36* (2006.01)
*G11C 19/28* (2006.01)

(52) U.S. Cl.
CPC ............ *H03K 17/162* (2013.01); *G09G 3/3677* (2013.01); *G09G 3/3696* (2013.01); *G11C 19/287* (2013.01); *G09G 2310/0286* (2013.01); *G09G 2320/02* (2013.01); *G09G 2320/0238* (2013.01)

(58) Field of Classification Search
CPC .................................................... H03K 17/162
USPC ........................................................ 345/212
See application file for complete search history.

(56) References Cited

U.S. PATENT DOCUMENTS

| | | | |
|---|---|---|---|
| 2005/0156860 A1* | 7/2005 | Kim ..................... | G09G 3/3677 345/100 |
| 2011/0274234 A1* | 11/2011 | Sakamoto ............ | G11C 19/184 377/64 |
| 2012/0082287 A1* | 4/2012 | Moriwaki ......... | H01L 29/78696 377/64 |

* cited by examiner

*Primary Examiner* — Jason Olson
(74) *Attorney, Agent, or Firm* — WPAT, PC; Justin King

(57) ABSTRACT

This disclosure provides a gate driver circuit in a display. The gate driver circuit includes shift registers configured for receiving clock and start signals and generating a gate signal to drive a row of the pixels, arranged at intersections of the gate lines and the data lines on a panel, each register comprising: a control unit having a clock input, a first voltage input, a second voltage input, and a first output; and a first output unit having a first pull-down TFT electrically connected to one of the first outputs and a gate-driving terminal configured for providing the gate signal; wherein one of the clock signals at the clock input is provided to the first output unit; and a first control signal's period at the first output is longer than the clock signal's period at the clock input and shorter than the period of a frame.

11 Claims, 15 Drawing Sheets

GATE DRIVER CIRCUIT AND DISPLAY
APPARATUS HAVING THE SAME

This application claims the benefit of Taiwan application Serial No. 101130268, filed Aug. 21, 2012, the disclosure of which is incorporated by reference herein in its entirety.

TECHNICAL FIELD

The present disclosure relates to the field of driver circuit, and more particularly, to a gate driver circuit and a display apparatus with the gate driver circuit.

TECHNICAL BACKGROUND

A driver circuit is a key component in a liquid-crystal display (LCD). Conventionally, the driver circuit was fabricated in the form of integrated circuit (IC) to drive an LCD panel. Further, to reduce the fabrication cost and improve the device performance, an amorphous-silicon integrated gate driver, hereafter "ASG", has been developed, in which the gate driver is integrated into the LCD panel in the array process of the amorphous-silicon-based display manufacturing. This scheme is also referred to as the gate driver on array (GOA) or the gate driver on panel (GOP).

FIG. 1 schematically shows a circuit diagram of a prior-art GOA, and FIG. 2 shows an output gate signal Gate1 in FIG. 1, in comparison with its input clock signal CK1. The GOA circuit may include a starting input terminal STV, three clock input terminals CLK1/CLK3/CLK5, a control unit with two output terminals P and Z, thin-film transistors (TFTs) M1-M5, a low-level voltage VGL, an output terminal Gate1 for the scanning signal, and a capacitor Cb. Generally, the TFT M1, the key component of the output stage, has large capacitances Cgd (between its gate and drain) and Cgs (between its gate and source) due to its large size. This renders the coupling between the clock signal at the clock input terminal CLK1 and the parasitic capacitor in the TFT M1 when the clock signal rises up or falls down, so that ripples may appear in the scanning signal at the output terminal Gate1. The ripples, including positive ones (going up) and negative ones (going down), may influence the pixel voltage of the LCD.

FIG. 3 schematically shows a circuit diagram of a GOA-based display panel, in which the effects of the positive ripples on the gate driver circuit is also shown. The output terminal Gate1 is electrically connected to the gate of the pixel TFT in the pixel unit through the scan line. The scanning signal at the output terminal Gate1 is used to control the pixel TFT to be in the ON or OFF state.

In the period indicated as Tn in FIG. 3, the data in the data signal Vdata may be written into the pixel unit. When the pixel TFT is turned on, the pixel voltage Vpixel may rise up to the voltage Vd and then fall down to the voltage Vp in the period Tn. The pixel TFT in the pixel unit is controlled by the scanning signal at the output terminal Gate1 of the gate driver circuit, which is electrically connected to the gate of the pixel TFT. Ideally, if the scanning signal is in a LOW-level voltage, the pixel TFT in the pixel unit will be turned off. However, the pixel TFT may not stay in the OFF state completely due to a leakage current Ioff flowing from Vpixel to Vdata, because the ripple voltage may still bias the gate of the pixel TFT. Wherein, the ripple voltage comes from the rippled clock signals in the output stage (or the TFT M1) of the GOA, which is electrically coupled to the scan line. Consequently, the GOA may generate a ripple in each of the scan lines in every period Tn.

The positive ripples may affect an image contrast on the display panel. A positive ripple with a large peak voltage may cause a leakage current flowing in the pixel TFT to lower the pixel voltage Vpixel, rendering insufficient darkness for a black image. The contrast ratio of a display system can be defined as the ratio of the luminance of a white image (the brightest color) to that of a black image (the darkest color) therein, so the positive ripple may further downgrade the contrast ratio of the display.

FIG. 4 schematically shows an output signal of a GOA in a prior-art 3.5-inch QVGA (Quarter video graphics array) display by simulation. FIG. 5 shows current-voltage characteristic curves of the QVGA display for various testing time. FIG. 6 shows a measured output signal of the QVGA display of FIG. 4. If a pull-down TFT (such as the TFT M3 in FIG. 1) is biased by a clock signal at a high temperature (e.g., 80° C.), its threshold voltage Vth will shift, as shown in FIG. 5. This may produce a downgrade of the pull-down capacity of the TFT and pulses in its output voltage as shown in FIGS. 4 and 6, further causing a flashing phenomenon on the display image.

Therefore, it is in need to develop a new gate driver circuit and a display apparatus using the gate driver circuit, to alleviate the above-described problems.

TECHNICAL SUMMARY

This disclosure is to reduce the frequency of the control signal in the pull-down TFT of a GOA output circuit, so as to extend the control signal's period. Thereby, the ripple in the control signal can be diminished, the shifting of its threshold voltage can be slowed down, and thus the performance and reliability of the gate driver circuit and the display apparatus can be improved.

According to one aspect of the present disclosure, one embodiment provides a gate driver circuit having a plurality of shift registers, each of the shift registers configured for receiving at least one clock signal and a start signal and generating a gate signal to drive a row of the pixels, arranged at intersections of the gate lines and the data lines on a display panel, each of the shift registers comprising: a control unit having at least one clock input terminal, a first voltage input terminal, a second voltage input terminal, and at least one first output terminal; and a first output unit having a first pull-down TFT electrically connected to one of the first output terminals and a gate-driving terminal configured for providing the gate signal; wherein one of the clock signals at the clock input terminal is provided to the first output unit; and wherein a first control signal's period at the first output terminal is longer than the clock signal's period at the clock input terminal and shorter than the period of a frame.

According to another aspect of the present disclosure, another embodiment provides a display apparatus comprising a panel having a pixel portion including a plurality of pixels and a gate driver circuit electrically connected to the pixel portion, the gate driver circuit comprising a plurality of shift registers, each of the shift registers configured for receiving at least one clock signal and a start signal and generating a gate signal to drive a row of the pixels, arranged at intersections of the gate lines and the data lines on the panel, each of the shift registers comprising: a control unit having at least one clock input terminal, a first voltage input terminal, a second voltage input terminal, and at least one first output terminal; and a first output unit having a first pull-down TFT electrically connected to one of the first output terminals and a gate-driving terminal configured for providing the gate signal; wherein one of the clock signals at the clock input terminal is provided to the first output unit; and wherein a first control signal's period at the first output terminal is longer than the clock signal's period at the clock input terminal and shorter than the period of a frame.

In the embodiment, the control unit may further comprise a second output terminal and a second output unit having a second pull-down TFT electrically connected to the second output terminal and the gate-driving terminal; the other one of the clock signal at the clock input terminal is provided to the second output unit, and a second control signal's period at the second output terminal is longer than the clock signal's period selected at the clock input terminal and shorter than the period of a frame.

In the embodiment, the first voltage input terminal may receive a first voltage signal, the second voltage input terminal may receive a second voltage signal, and the voltage signals may be processed by the control unit to produce the control signals to control the first and second output terminals, which further control ON-state and OFF-state durations of the first and second pull-down TFTs.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings. Although the terms "first", "second" and "third" are used to describe various elements, these elements should not be limited by the term. Also, unless otherwise defined, all terms are intended to have the same meaning as commonly understood by one of ordinary skill in the art.

Figure 1:
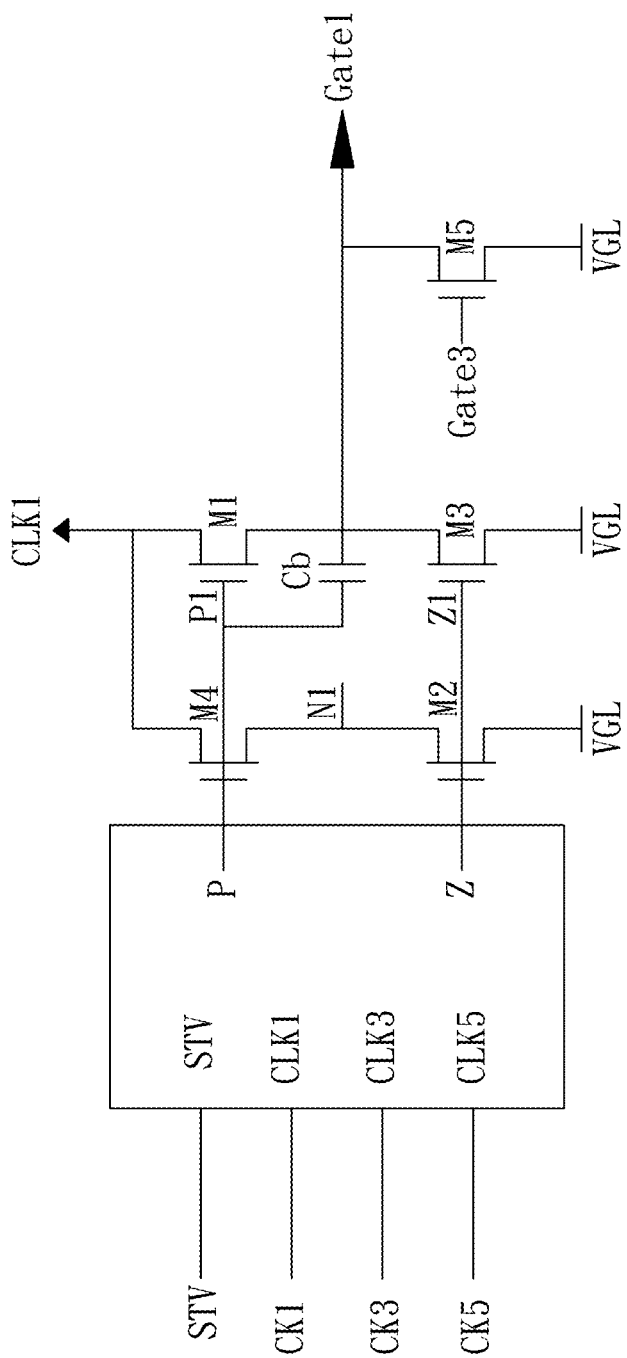
FIG. 1 schematically shows a circuit diagram of a prior-art GOA.
Figure 2:
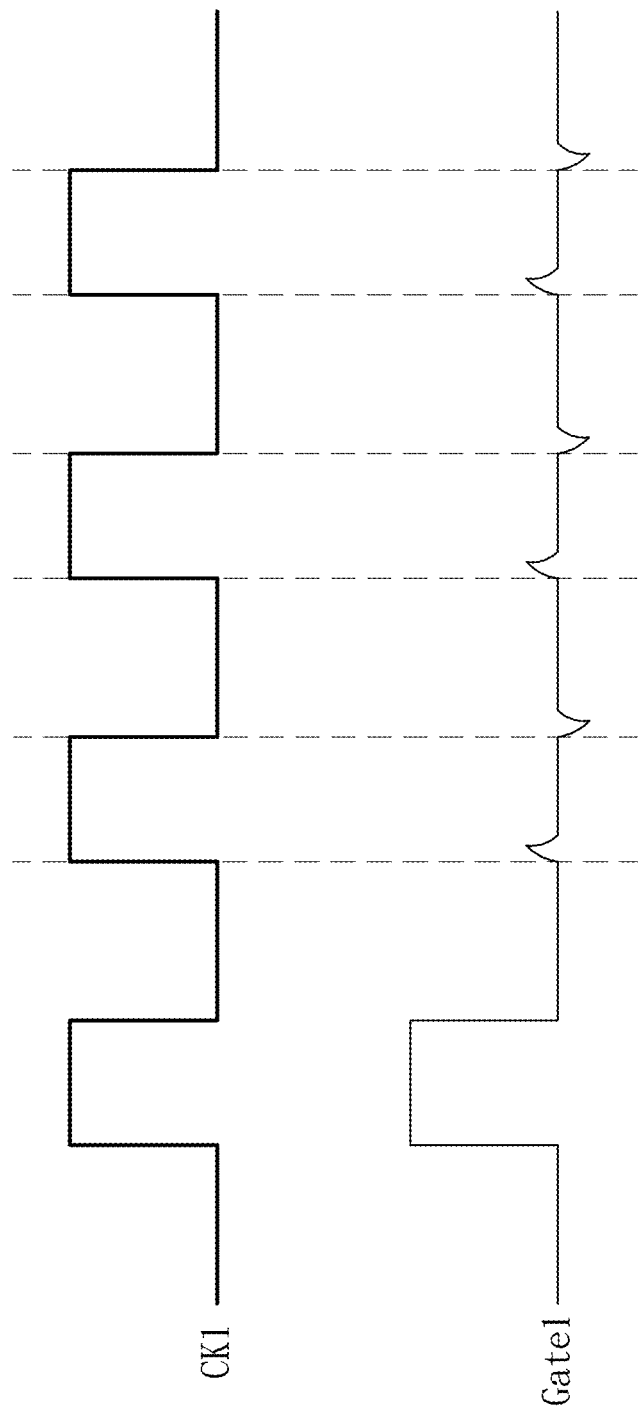
FIG. 2 shows an output gate signal in FIG. 1
Figure 3:
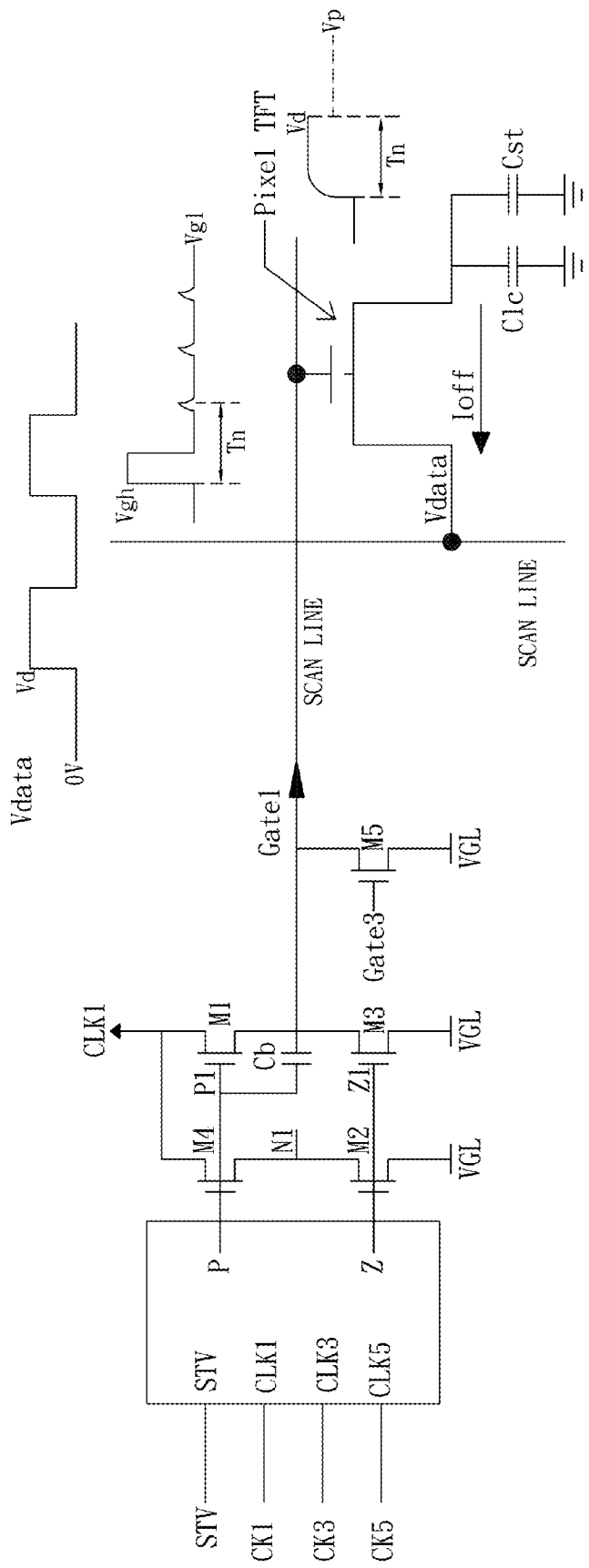
FIG. 3 schematically shows a circuit diagram of a GOA-based display panel and the effects of the positive ripples on the gate driver circuit.
Figure 4:
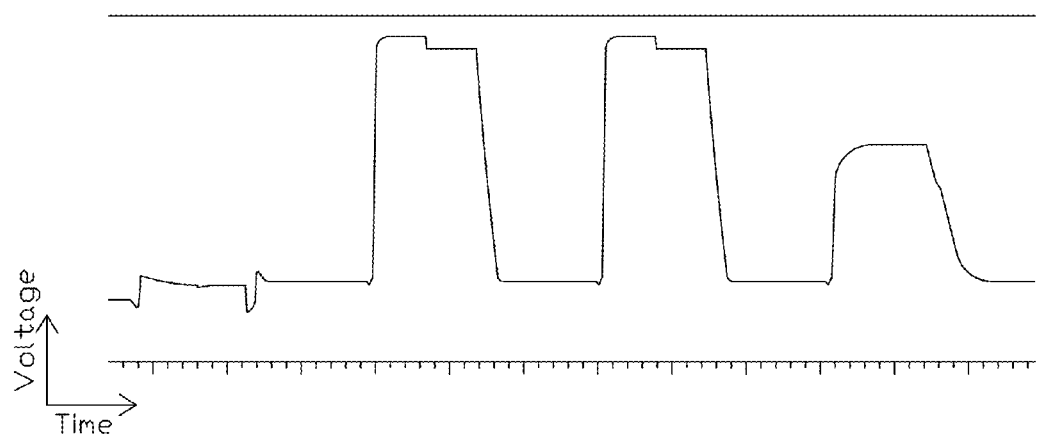
FIG. 4 schematically shows an output signal of a GOA in a prior-art 3.5-inch QVGA display by simulation.
Figure 5:
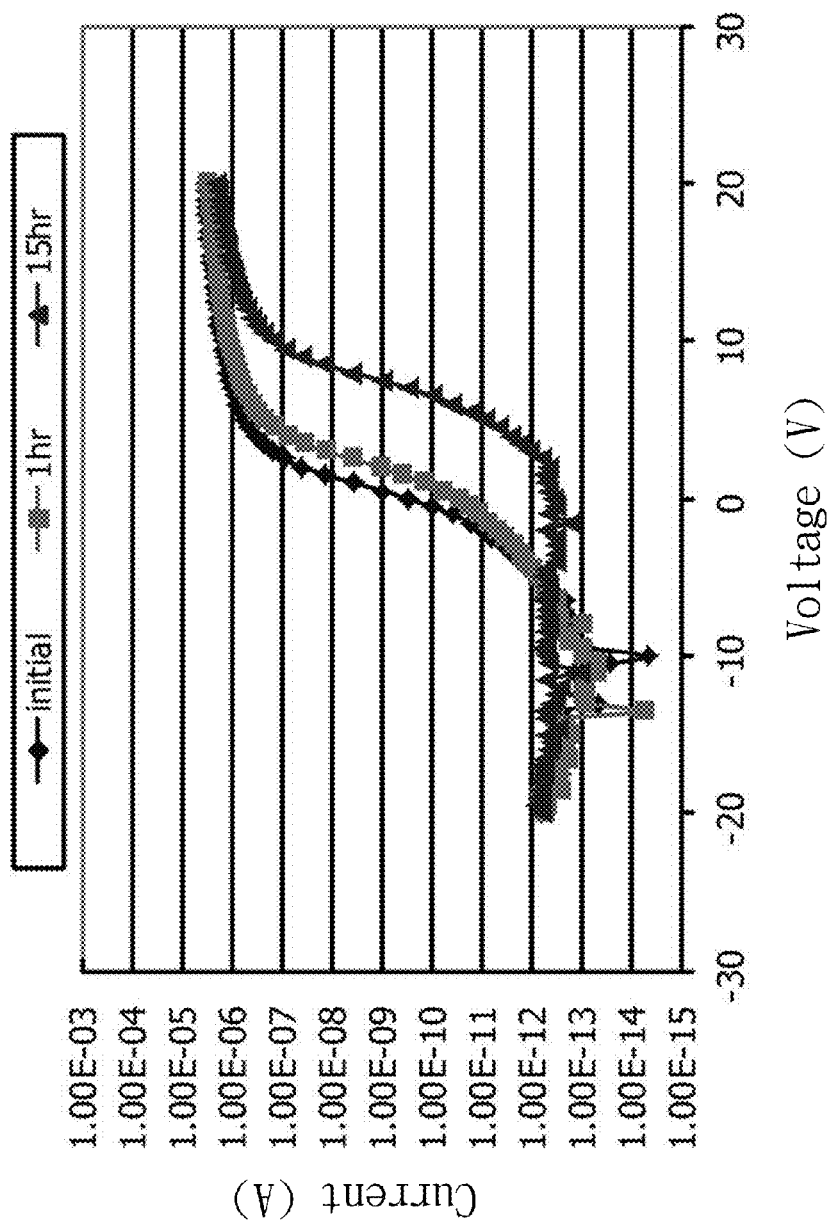
FIG. 5 shows current-voltage characteristic curves of the QVGA display for various testing time.
Figure 6:
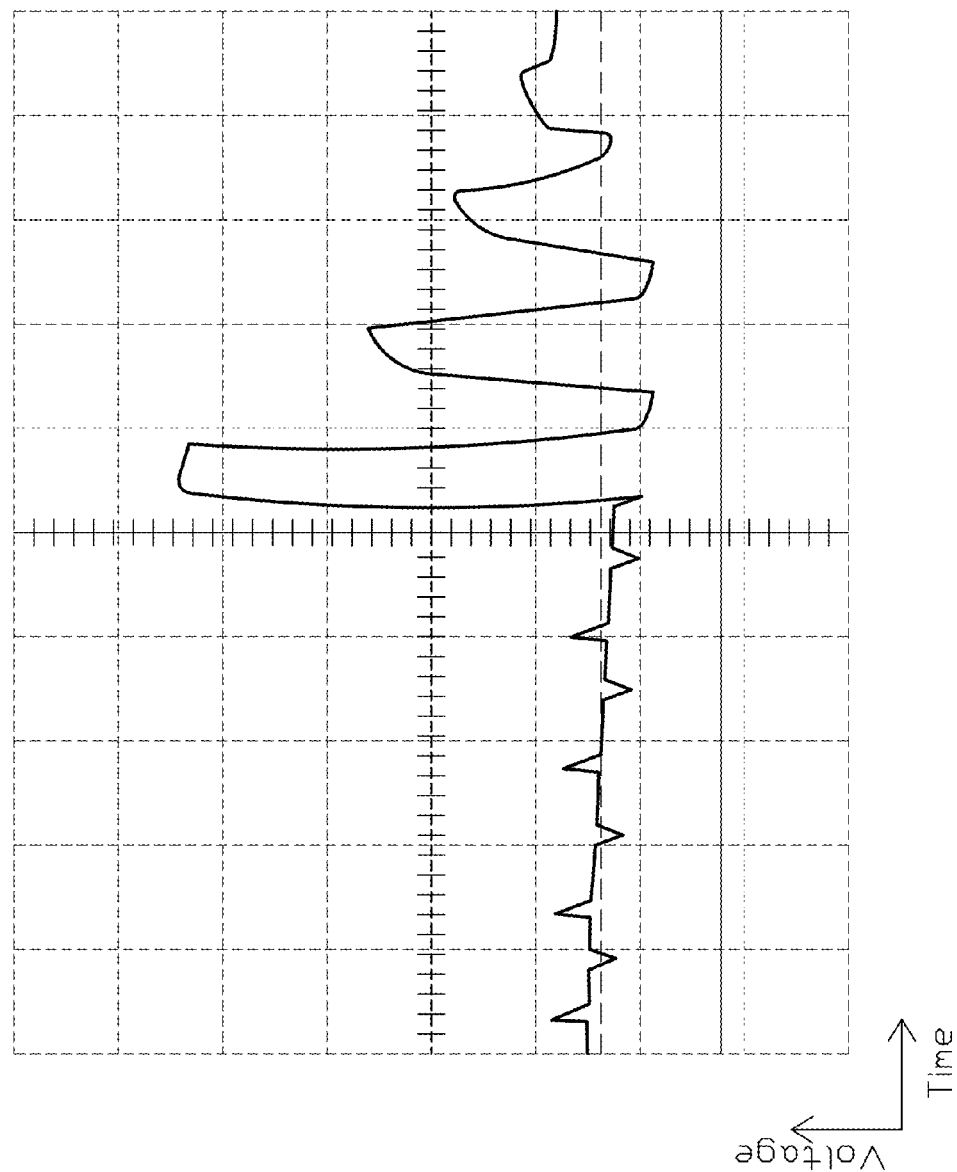
FIG. 6 shows a measured output signal of the QVGA display of FIG. 4.
Figure 7:
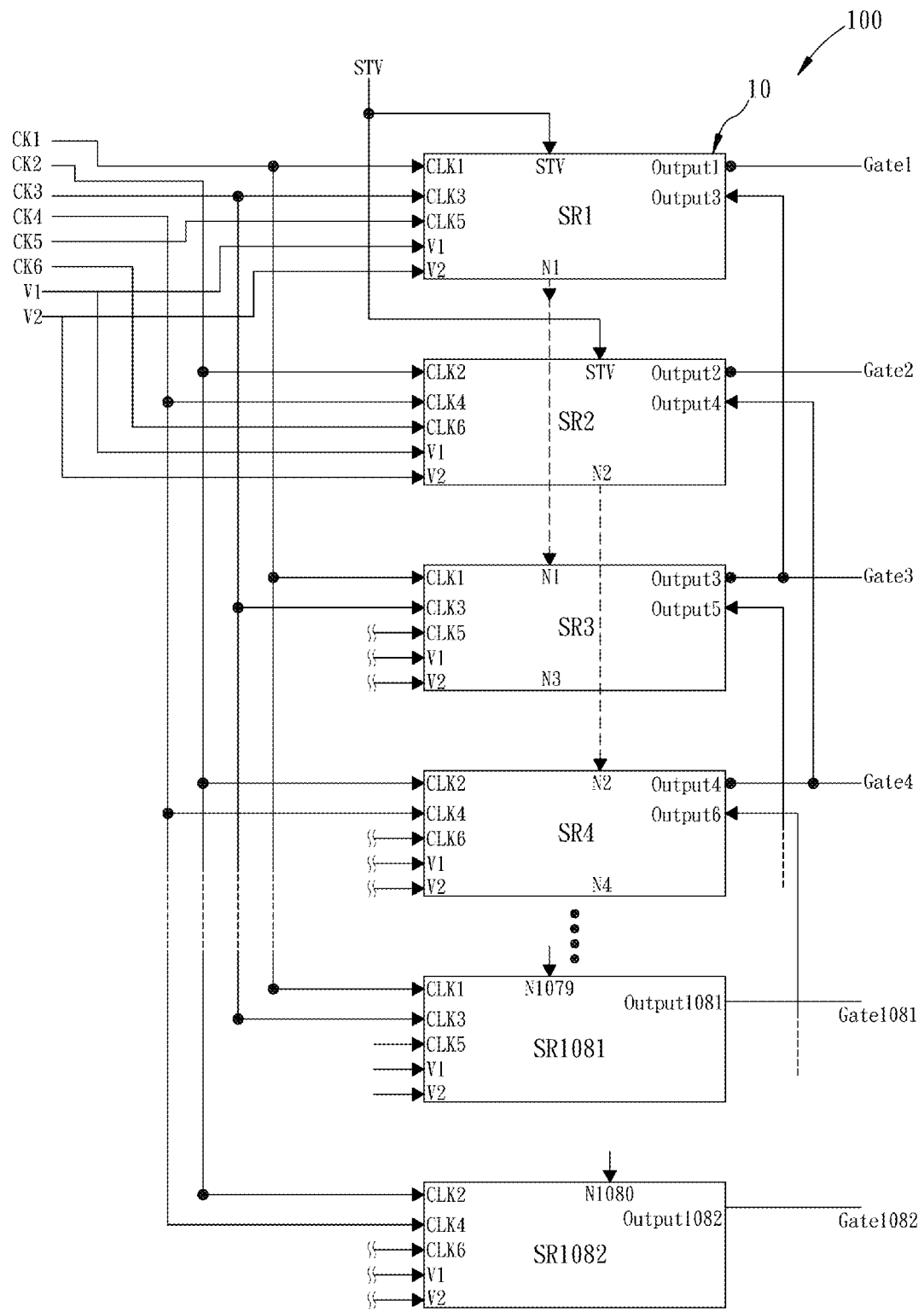
FIG. 7 schematically shows a block diagram of a gate driver circuit with multiple output stages according to an embodiment of this disclosure.
Figure 8:
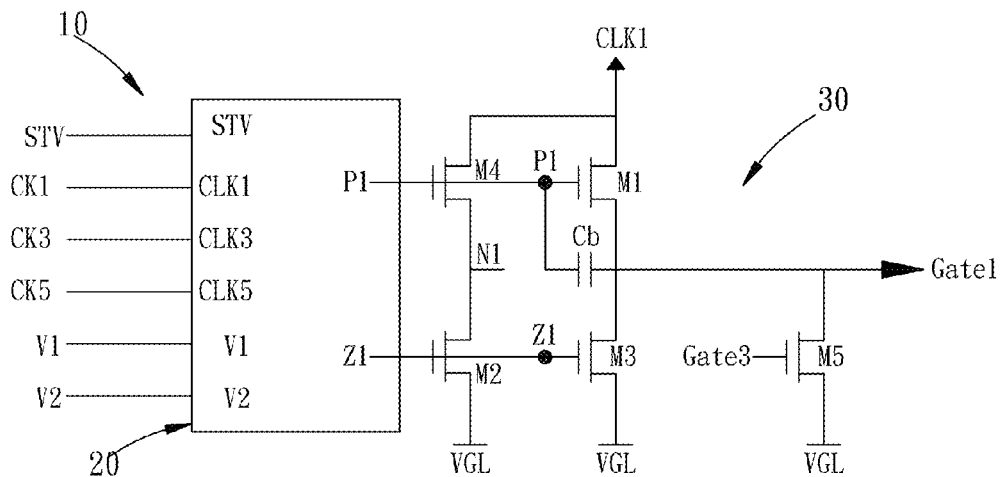
FIG. 8 shows a circuit diagram illustrating the gate driver circuit in the embodiment.
Figure 8:
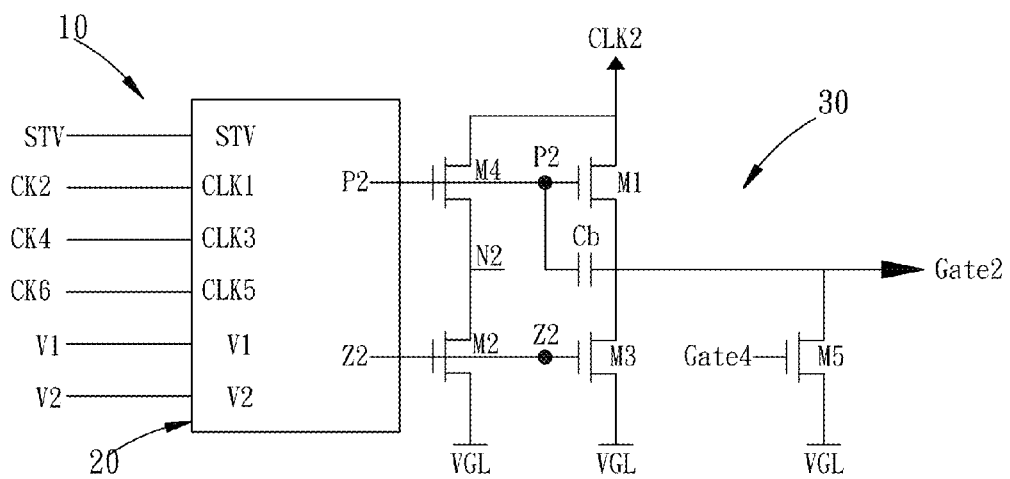
Figure 8:
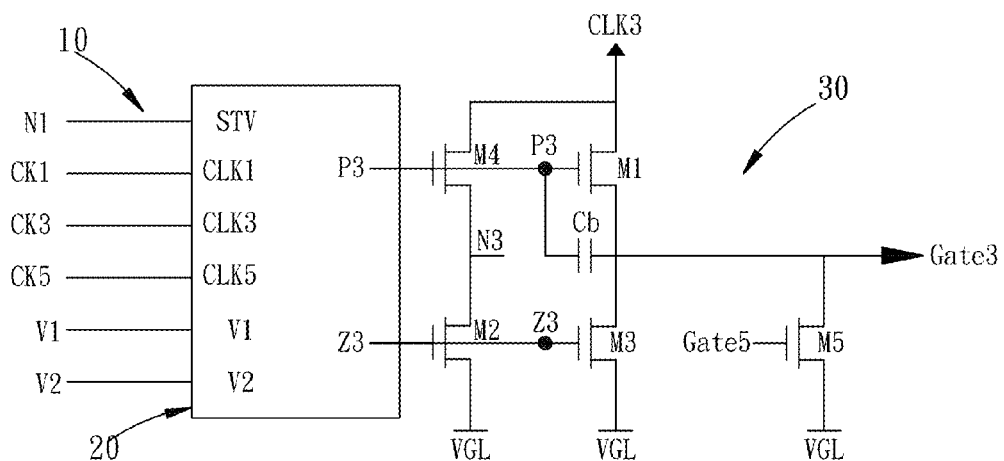
Figure 9:
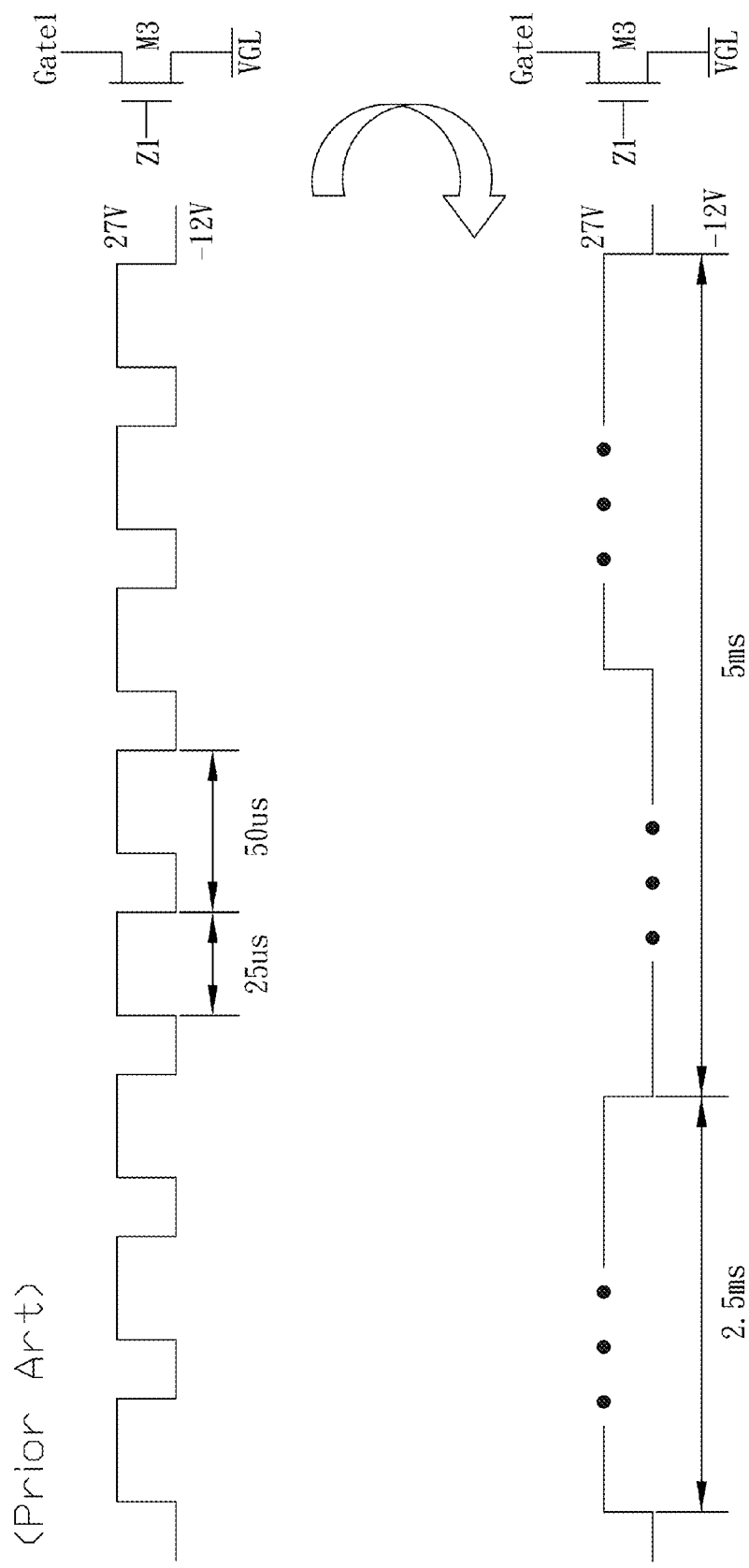
FIG. 9 shows a control signal configured for controlling a pull-down TFT in the embodiment, in comparison with that in the prior art.

FIG. 7 schematically shows a block diagram of a gate driver circuit 100 with multiple output stages according to an embodiment of this disclosure. FIG. 8 shows a circuit diagram illustrating the gate driver circuit 100 in the embodiment. FIG. 9 shows a control signal configured for controlling a pull-down TFT in the embodiment, in comparison with that in the prior art.

The gate driver circuit 100 includes a plurality of shift registers 10 disposed on a display panel (not shown). Each of the shift registers 10 (such as SR1, SR2, SR3, SR4, SR1081 and SR1082) is configured for receiving at least one clock signal CK1~CK6 and a start signal STV as well as generating a gate signal to drive a row of the pixels (not shown) arranged at intersections of the gate lines and the data lines through an output terminal (Output1, Output2, Output3, Output4, Output1081, Output1082). Each shift register 10 includes a control unit 20 and a first output unit 30.

The control unit 20 has a starting input terminal STV, at least one clock input terminal CLK1-CLK6, a first voltage input terminal V1, a second voltage input terminal V2, and a first output terminal Z1.

The first output unit 30 is electrically connected to the first output terminal Z1. The first output unit 30 includes a first pull-down TFT M3 (as shown in FIG. 8 and FIG. 9) electrically connected to the first output terminal Z1 and a gate-driving terminal P1 used to provide the gate signal Gate1. One of the clock signals CK1~CK6 is introduced to the first output unit 30. As shown in FIGS. 8 and 9, the first output unit 30 may further include TFTs (M1, M2, M4, M5), a low-level voltage VGL and a capacitor Cb. The gate signal Gate1 from the gate-driving terminal P1 can flow to the gate of its corresponding TFT.

A first control signal at the first output terminal Z1 may have a period (for example, the 5-ms time interval shown in the FIG. 9) larger than that of the clock signal CK1~CK6 (for example, 50 μs) at the clock input terminal CLK1-CLK6 and less than the period of a frame in the image processing system. Wherein, the control signal of 50-μs period at the first output terminal Z1 in the prior art (for example, the 50-μs time interval in the FIG. 9) is used as the clock signal CK1~CK6 in this embodiment. Thereby, the control signal for the first pull-down TFT M3 can have a prolonged duration of being at the HIGH-state voltage, so as to prevent the scanning signal at the output terminal Gate1 from being rippled and thus to reduce the leak current in the display panel caused by the scanning signal at the output terminal Gate1.

Figure 10:
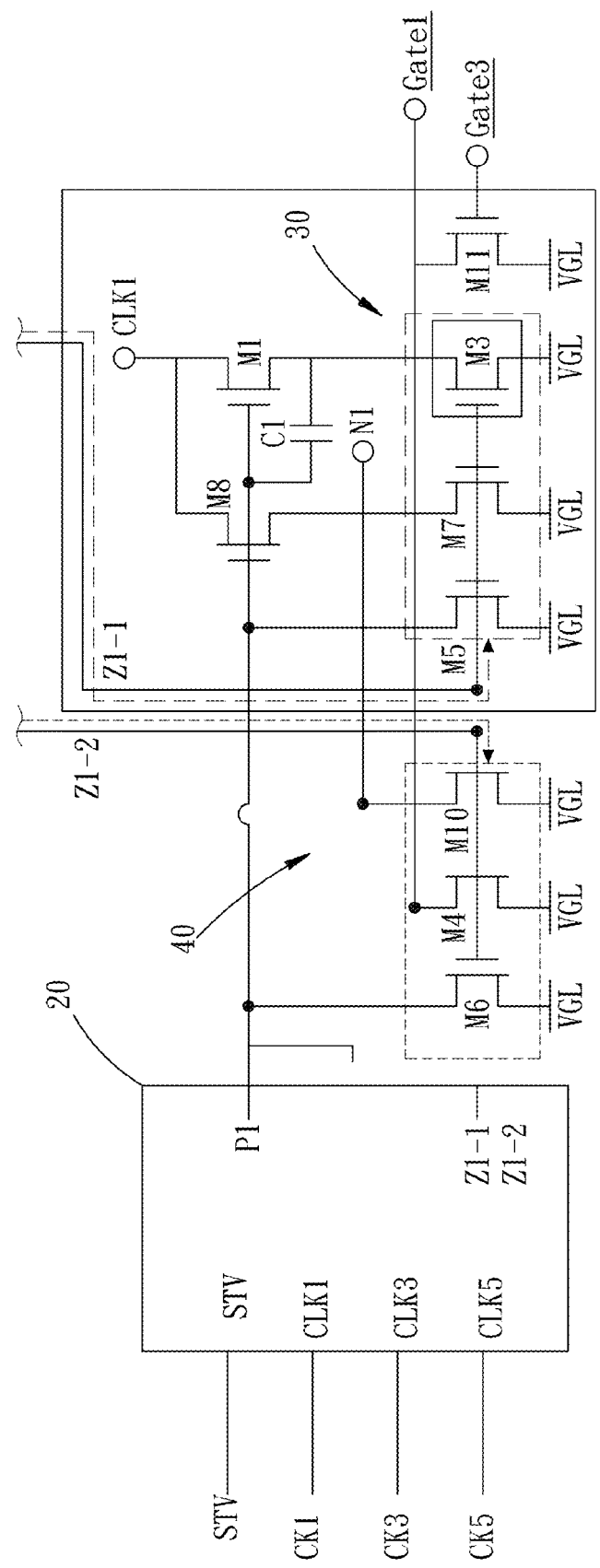
FIG. 10 schematically shows a circuit diagram of a shift register with multiple output stages according to another embodiment of this disclosure.
Figure 11:
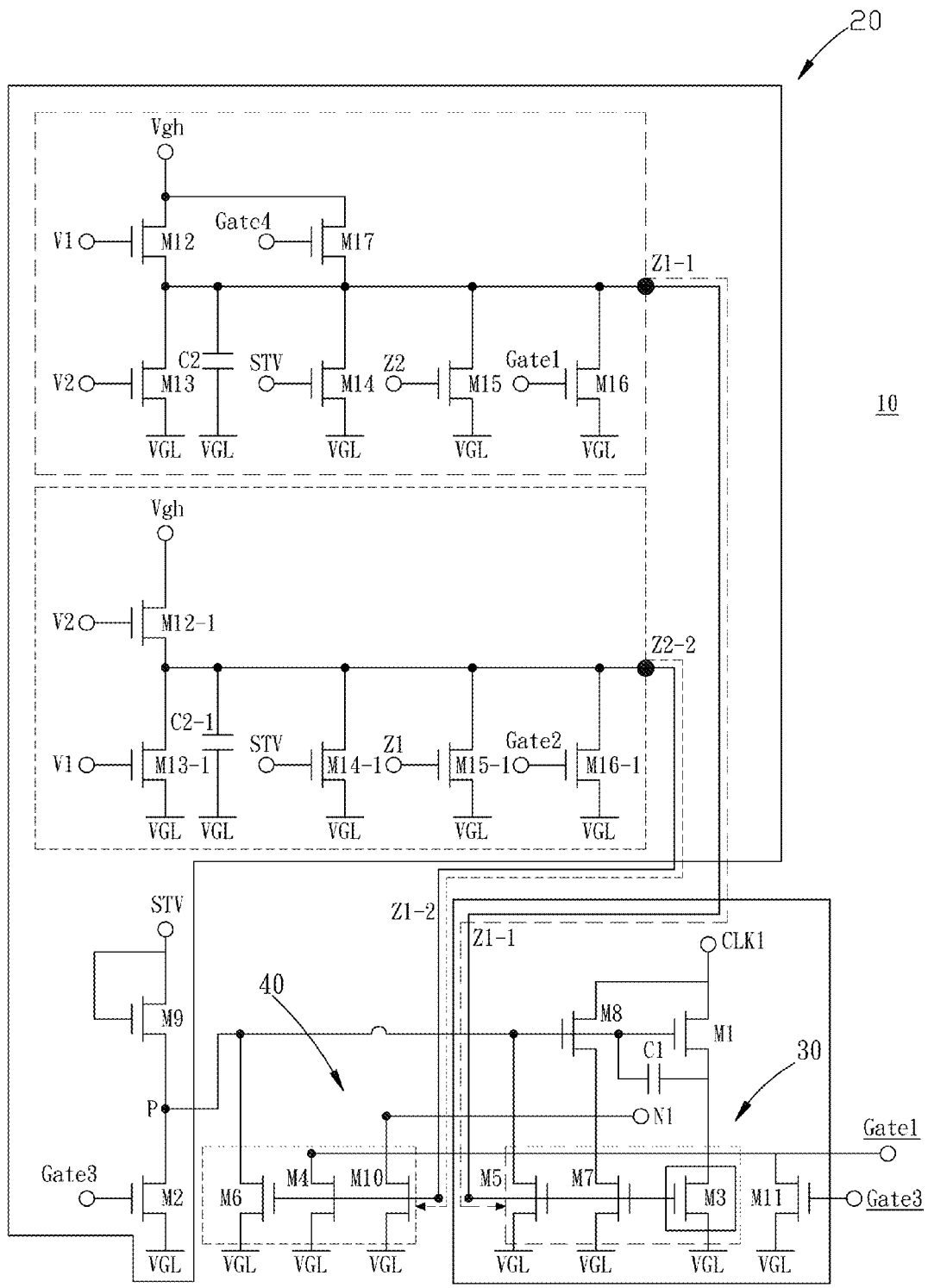
FIG. 11 shows a circuit diagram illustrating the shift register of the embodiment in detail.
Figure 12:
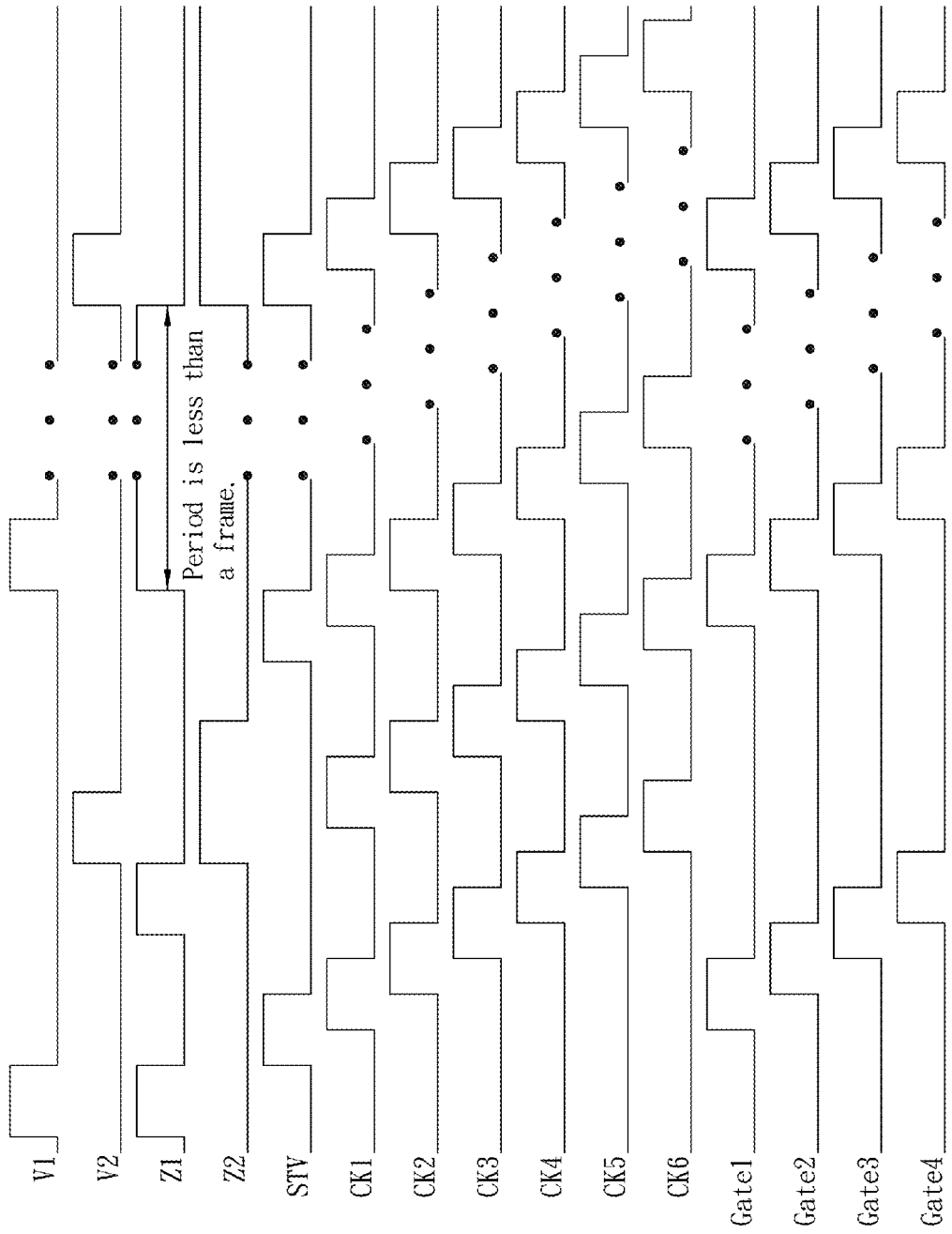
FIG. 12 shows the input and output signals in the shift register of FIGS. 10 and 11.

Moreover, FIG. 10 schematically shows a circuit diagram of a shift register 10 with multiple output stages according to another embodiment of this disclosure, FIG. 11 shows a circuit diagram illustrating the shift register 10 of the embodiment in detail, and FIG. 12 shows the input and output signals in the shift register 10 of FIGS. 10 and 11. The shift register 10 further includes a second output unit 40, and the control unit 20 further includes a second output terminal Z1-2. The second output unit 40 is electrically connected to the second output terminal Z1-2. The second output unit 40 includes a second pull-down TFT M4 (as shown in FIGS. 10 and 11) electrically connected to the second output terminal Z1-2, and one of the clock signals CK1~CK6 is introduced to the second output unit 40. A second control signal at the second output terminal Z1-2 may have a period (for example, the 5-ms time interval shown in the FIG. 9) larger than that of the clock signal CK1~CK6 (for example, 50 µs) and less than the period of a frame in the image processing system. Wherein, the control signal of 50-µs period at the first output terminal Z1-1 in the prior art (for example, the 50-µs time interval in the FIG. 10) is used as the clock signal CK1~CK6 in this embodiment.

As shown in FIGS. 10 and 11, the control unit 20 may provide the first output terminal Z1-1 with signals through an interface circuit including TFTs (M12~M17), high-level voltage Vgh and low-level voltage VGL, and a capacitor C2. Also, the control unit 20 may provide the second output terminal Z1-2 with signals through another interface circuit including TFTs (M12-1~M16-1), high-level voltage Vgh and low-level voltage VGL, and a capacitor C2-1. The first output unit 30 may further include TFTs (M1, M3, M5, M7, M8, M11), a low-level voltage VGL and a capacitor C1, while the second output unit 40 may further include TFTs (M4, M6, M10) and a low-level voltage VGL. Moreover, the control unit 20 also includes a starting input terminal STV and TFTs M2 and M9.

Further, a first voltage signal at the first voltage input terminal V1 and a second voltage signal at the second voltage input terminal V2 are used to control the signal timing between the first pull-down TFT M3 of the first output unit 30 and the second pull-down TFT M4 of the second output unit 40, as shown in FIGS. 10 and 11. Thereby, the first pull-down TFT M3 and the second pull-down TFT M4 can be used to alternately provide the output terminal with a control signal to control the scanning signals and, thus, the control signal may have a longer period than that in the previous embodiment of FIG. 8, which have only one pull-down TFT M3. The Vth shifting problem can therefore be alleviated.

Figure 13:
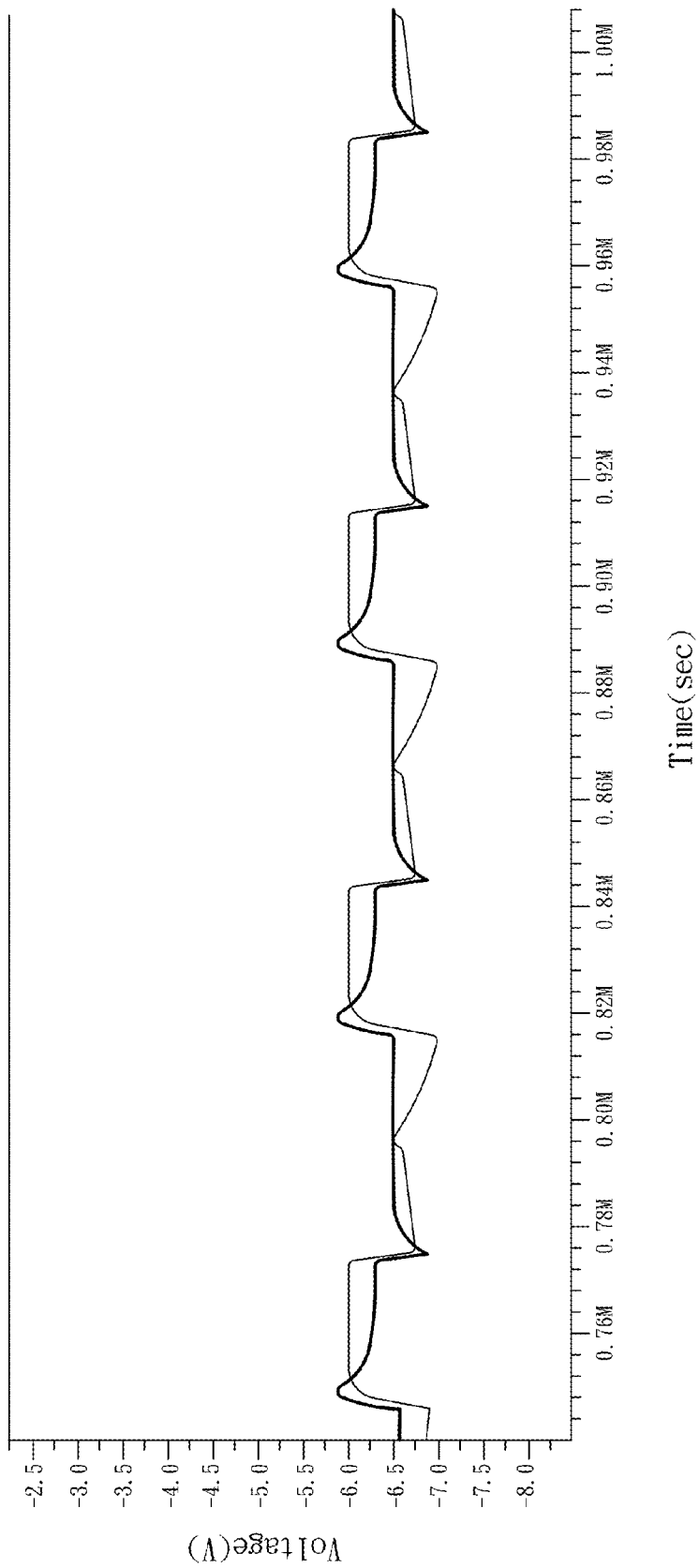
FIG. 13 shows output signal waveforms of the present and prior-art gate driver circuits for comparison.
Figure 14:
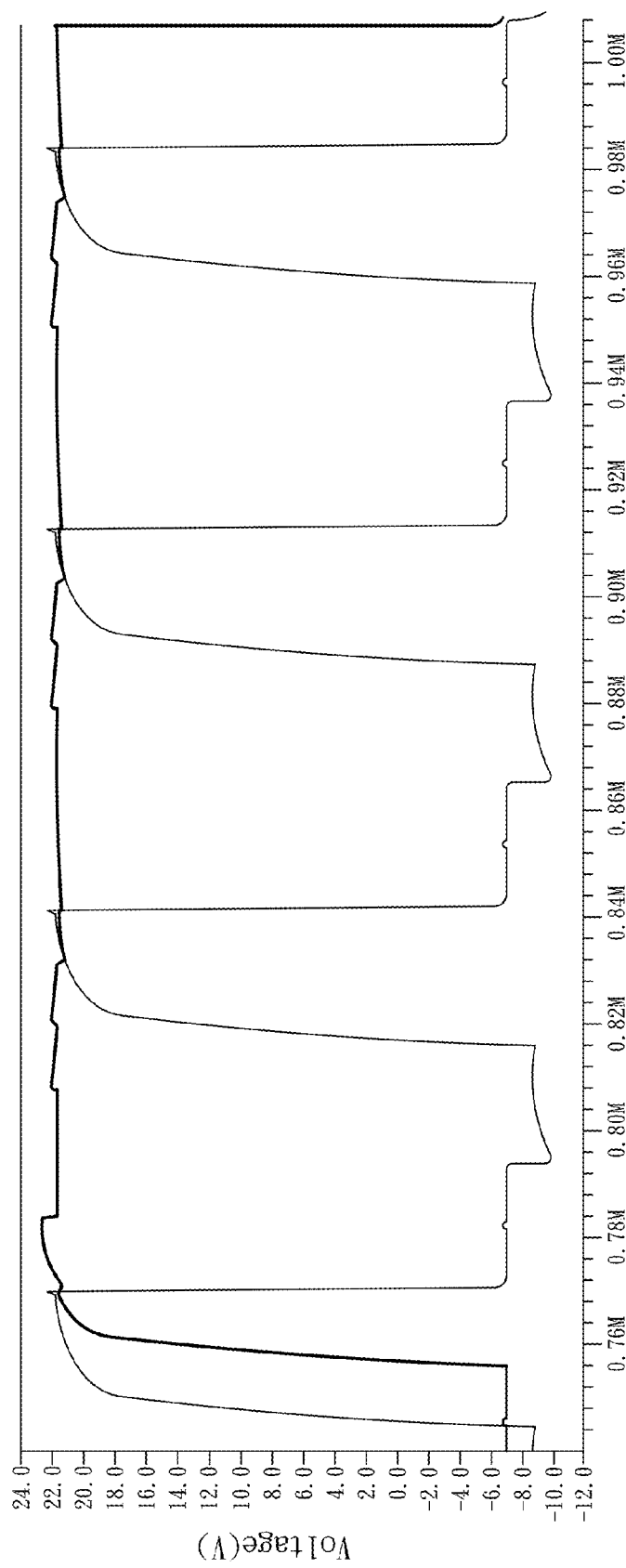
FIG. 14 shows control signal waveforms of the present and prior-art gate driver circuits.
Figure 15:
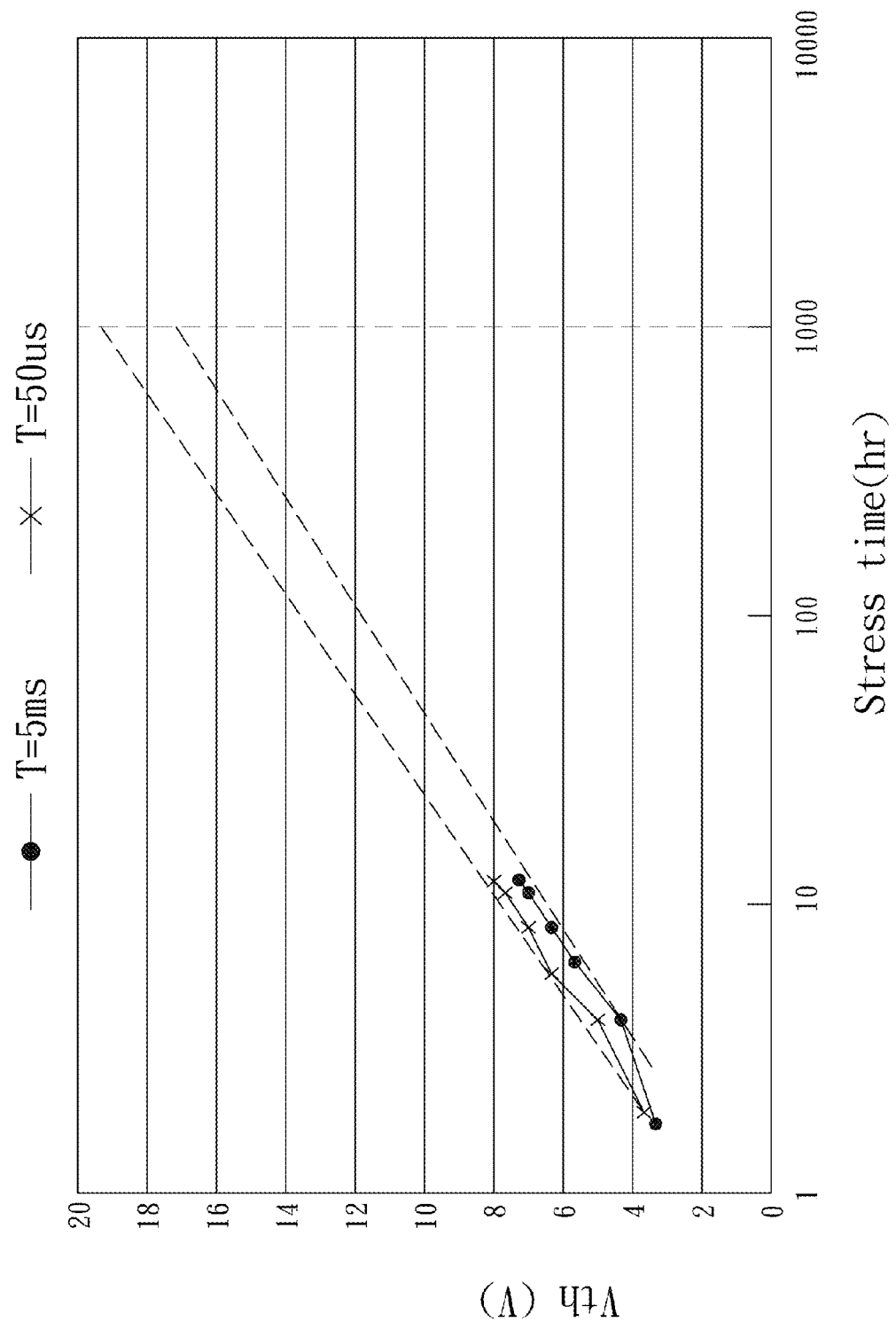
FIG. 15 shows threshold voltages of the present and prior-art gate driver circuits versus the stressing time for comparison.

FIG. 13 shows output signal waveforms of the present and prior-art gate driver circuits for comparison, FIG. 14 shows control signal waveforms of the present and prior-art gate driver circuits, and FIG. 15 shows threshold voltages (Vth) of the present and prior-art gate driver circuits versus the stressing time for comparison.

As shown in FIG. 14, the period of the control signal of the gate driver circuit 100 in the embodiment is larger than that of the gate driver circuit in the prior art. As shown in FIG. 13, the ripples in the output signal of the gate driver circuit 100 in the embodiment are diminished remarkably, in comparison with those of the gate driver circuit in the prior art. As shown in FIG. 15, the Vth curve of the gate driver circuit 100 in the embodiment with a 5-ms period is less sloped, in comparison with that of the gate driver circuit in the prior art. It implies that the Vth shifting problem in the gate driver circuit can be alleviated. As a consequence, the control signal of the pull-down TFT (M3 or/and M4) will extend its HIGH-state duration to become a low-frequency AC signal, so as to keep down the ripple, slow down the Vth shifting and, thus, improve the reliability of the gate driver circuit.

The gate driver circuit 100 in the embodiment can be applied to a display apparatus (not shown), which includes a display panel having a pixel portion (not shown) including a plurality of pixels (not shown), a gate driver circuit electrically connected to the pixel portion, and a backlight unit.

The display panel may furthering include the display portion, a wiring portion, and an attaching portion. The attaching portion is used to attach some source driver ICs and a printed circuit board (PCB) including at least one flexible PCB or at least one rigid PCB. In another embodiment, the gate driver circuit 100 in this disclosure can be arranged in the wiring portion of the display panel. Thereby, the control signal of the pull-down TFT (M3 or/and M4) in the gate driver circuit 100 will extend its HIGH-state duration to become a low-frequency AC signal, so as to keep down the ripple, slow down the Vth shifting and, thus, improve the reliability of the display apparatus. The control signal of the pull-down TFT extending its HIGH-state duration and HIGH-state duration is longer than the clock signal's period at clock input terminal.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A gate driver circuit having a plurality of shift registers, each of the shift registers configured for receiving at least one clock signal and a start signal and generating a gate signal to drive a row of the pixels, arranged at intersections of the gate lines and the data lines on a display panel, the shift register comprising:

a control unit having at least one clock input terminal, a first voltage input terminal, a second voltage input terminal, and at least one first output terminal; and a first output unit having a first pull-down TFT electrically connected to one of the first output terminals and a gate-driving terminal configured for providing the gate signal;

wherein one of the clock signals at the clock input terminal is provided to the first output unit;

wherein a first control signal's period at the first output terminal is longer than the clock signal's period at the clock input terminal and shorter than the period of a frame; and wherein the control unit further comprises a second output terminal and a second output unit having a second pull-down TFT electrically connected to the second output terminal and the gate-driving terminal; the other one of the clock signal at the clock input terminal is provided to the second output unit, and a second control signal's period at the second output terminal is longer than the clock signal's period selected at the clock input terminal and shorter than the period of a frame.

2. The gate driver circuit according to claim 1, wherein the first voltage input terminal receives a first voltage signal, the second voltage input terminal receives a second voltage signal, and the voltage signals are processed by the control unit to produce the control signals to control the first and second output terminals, which further control ON-state and OFF-state durations of the first and second pull-down TFTs.

3. The gate driver circuit according to claim 1, wherein the first control signal's period at the first output terminal is equal to the second control signal's period at the second output terminal.

4. A display apparatus comprising a panel having a gate driver circuit, the gate driver circuit comprising a plurality of shift registers, each of the shift registers configured for receiving at least one clock signal and a start signal and generating a gate signal to drive a row of the pixels, arranged at intersections of the gate lines and the data lines on the panel, the shift register comprising:
   a control unit having at least one clock input terminal, a first voltage input terminal, a second voltage input terminal, and at least one first output terminal; and
   a first output unit having a first pull-down TFT electrically connected to one of the first output terminals and a gate-driving terminal configured for providing the gate signal;
   wherein one of the clock signals at the clock input terminal is provided to the first output unit;
   wherein a first control signal's period at the first output terminal is longer than the clock signal's period at the clock input terminal and shorter than the period of a frame; and
   wherein the control unit further comprises a second output terminal and a second output unit having a second pull-down TFT electrically connected to the second output terminal and the gate-driving terminal; the other one of the clock signal at the clock input terminal is provided to the second output unit, and a second control signal's period selected at the clock input terminal at the second output terminal is longer than the clock signal's period and shorter than the period of a frame.

5. The display apparatus according to claim 4, wherein the first voltage input terminal receives a first voltage signal, the second voltage input terminal receives a second voltage signal, and the voltage signals are processed by the control unit to produce the control signals to control the first and second output terminals, which further control ON-state and OFF-state durations of the first and second pull-down TFTs.

6. The display apparatus according to claim 4, wherein the first control signal's period at the first output terminal is equal to the second control signal's period at the second output terminal.

7. A display device comprising:
   a pixel portion including a plurality of pixels, arranged at intersections of the gate lines and the data lines on a display panel; and
   a gate driver circuit electrically connected to the pixel portion and having a plurality of shift registers,
   wherein the shift registers configured for receiving at least one clock signal and a start signal and generating a gate signal to drive a row of the pixels:
   wherein the shift register comprising:
      a control unit having at least one clock input terminal, a first voltage input terminal, a second voltage input terminal, and at least one first output terminal, and one of the clock signals at the clock input terminal is provided to the first output unit; and
      a first output unit having at least one pull-down TFT electrically connected to one of the first output terminals and a gate-driving terminal configured for providing the gate signal;
   wherein the control signal of the pull-down TFT extending its HIGH-state duration and HIGH-state duration is longer than the clock signal's period at clock input terminal; and
   wherein the control unit further comprises a second output terminal and a second output unit having a second pull-down TFT electrically connected to the second output terminal and the gate-driving terminal; the other one of the clock signal at the clock input terminal is provided to the second output unit, and a second control signal's period selected at the clock input terminal at the second output terminal is longer than the clock signal's period and shorter than the period of a frame.

8. The display apparatus according to claim 7, wherein the first voltage input terminal receives a first voltage signal, the second voltage input terminal receives a second voltage signal, and the voltage signals are processed by the control unit to produce the control signals to control the first and second output terminals, which further control ON-state and OFF-state durations of the first and second pull-down TFTs.

9. The display apparatus according to claim 7, wherein the first control signal's period at the first output terminal is equal to the second control signal's period at the second output terminal.

10. The display apparatus according to claim 7, wherein a first control signal's period at the first output terminal is longer than the clock signal's period at the clock input terminal.

11. The display apparatus according to claim 7, wherein the first control signal's period at the first output terminal is shorter than the period of a frame.

* * * * *